United States Patent [19]

Abe et al.

[11] Patent Number: 4,882,740

[45] Date of Patent: Nov. 21, 1989

[54] FREQUENCY COUNTER FOR COUNTING A FREQUENCY AND PARTLY VARIED FREQUENCIES OF A SIGNAL IN REAL TIME

[75] Inventors: Yoshitaka Abe; Keiichi Murakami, both of Kawasaki, Japan

[73] Assignee: Fujitsu Limited, Kawasaki, Japan

[21] Appl. No.: 160,227

[22] Filed: Feb. 25, 1988

[30] Foreign Application Priority Data

Mar. 16, 1987 [JP] Japan ................................. 62-60417

[51] Int. Cl.⁴ ............................................. G01R 23/10
[52] U.S. Cl. .......................................... 377/49; 377/55; 328/158; 328/140; 307/354; 324/78 D
[58] Field of Search ........................ 377/55, 20, 45, 49; 328/158, 140; 324/78 D; 307/354

[56] References Cited

U.S. PATENT DOCUMENTS

| 3,521,176 | 7/1970 | Box et al. | 328/141 |
|---|---|---|---|
| 3,548,183 | 12/1970 | Jouve | 377/45 |
| 3,603,769 | 9/1971 | Malcolm | 377/45 |
| 3,717,757 | 2/1973 | Falvert et al. | 377/45 |
| 3,924,183 | 12/1974 | Fletcher | 328/134 |
| 3,993,984 | 11/1976 | Penrod | 324/78 D |
| 4,468,796 | 8/1984 | Suga | 324/78 D |
| 4,558,456 | 12/1985 | Bezard et al. | 377/20 |
| 4,581,713 | 4/1986 | Fennel | 377/49 |
| 4,624,005 | 11/1986 | Tachino | 377/20 |
| 4,680,540 | 7/1987 | Niki et al. | 324/78 D |

FOREIGN PATENT DOCUMENTS 0087025 8/1983 European Pat. Off. .
029657 3/1980 United Kingdom .

Primary Examiner—John S. Heyman
Attorney, Agent, or Firm—Armstrong, Nikaido Marmelstein Kubovcik & Murray

[57] ABSTRACT

A frequency of a signal, particularly a frequency, partly varied as time passes, of a signal is counted in real time by producing a delay signal by delaying the signal as much as a predetermined time, detecting delayed zero-cross pulses from the delayed signal, detecting zero-cross pulses from the non-delayed signal, counting a first number of the delayed zero-cross pulses after the predetermined time is over, counting a second number of the zero-cross pulses during and after the predetermined time, producing a number difference between the first number and the second number by subtracting the first number from the second number and halving the number difference. The predetermined time is designated longer than a half period of the signal frequency to be counted. When the predetermined time is set long, the average frequency of the signal is counted, and when that is set short comparing with the partly varied interval of the signal frequency, the partly varied frequency of the signal is counted in real time.

3 Claims, 6 Drawing Sheets

FIG. 1 PRIOR ART
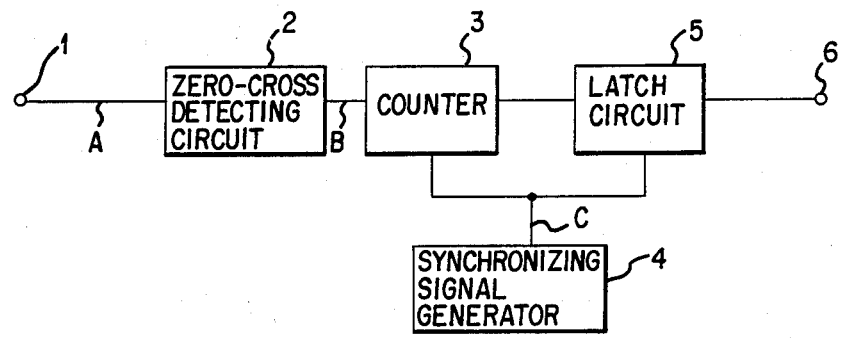
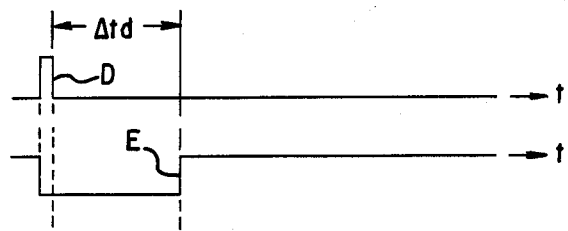
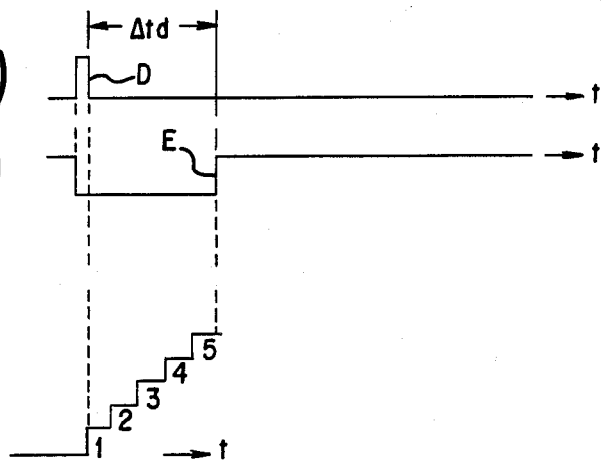

FREQUENCY COUNTER FOR COUNTING A FREQUENCY AND PARTLY VARIED FREQUENCIES OF A SIGNAL IN REAL TIME

BACKGROUND OF THE INVENTION

The present invention relates to a frequency counter for counting a signal frequency and particularly for counting in real time the signal frequencies partly varying as time passes.

In recent science and engineering field, there are many cases that significant information is obtained from frequency variation of a signal. For example, in ultrasonics, frequencies of echo signals obtained by reflected ultrasound waves from targets located along the transmission direction of a bursted ultrasound wave are varied because of a characteristic of respective target. In other words, the characteristic of respective target can be studied by counting the frequency variation of the ultrasound echo signal from respective target. The same advantage can be obtained in other cases such as a case of Doppler effect application. As well known, in the case of Doppler frequency, the frequency variation gives the information of the movement of a target.

In such cases, if the frequency variation can be counted in real time, more advantage could be obtained. For instance, in the case of the ultrasonics, if the frequency variation due to the target characteristic is counted in real time, quick target response to, for example, some action added to the target may be analyzed, and from which new information of the target characteristic could be studied. In the case of Doppler effect, the quick movement of the target can be studied more precisely. However, in the prior art, it has been not easy to count the frequency variation in real time.

FIG. 1 is a block diagram of the frequency counter of the prior art, and typical waveforms are shown in FIGS. 2(a), 2(b) and 2(c) respectively to the signals having reference letters A, B and C in FIG. 1. In FIG. 1, an input signal A received at an input terminal 1 is led to a zero-cross detecting circuit 2 and detected therein so that a zero-cross signal B shown in FIG. 2(b) is output. The zero-cross signal B is led to a counter 3 in which the number of pulses of the zero-cross signal B is counted during a time interval $\Delta t$. Before counting the pulses, the counter 3 is cleared every time when a synchronizing signal C, generated at a synchronizing signal generator 4, is applied to the counter 3, and counts the number of pulses until the counter 3 is cleared by the next synchronizing signal C. The synchronizing signal is a train of positive narrow pulses having a time period $\Delta T$. Wherein, the interval $\Delta t$ is equal to a time interval from the trailing edge of a synchronizing pulse to the leading edge of the succeeding synchronizing pulse. The output signal from the counter 3 is led to a latch circuit 5 in which the output signal is latched until the counter 3 is cleared by the succeeding clear pulse, so that the numbers of the zero-cross signals in every interval $\Delta t$ is output from an output terminal 6.

As seen from the above, in the prior art, the frequency counter counts the number of the zero-cross signals in the interval $\Delta t$. Therefore, there is a problem in the prior art that it is impossible to count the number (in other words, the frequency) partly varied within the interval $\Delta t$. Of cause, it is impossible to count it in real time.

If a partly varied frequency of the zero-cross signal in the interval $\Delta t$ is attempted to be forcibly counted by the prior art frequency counter, whereby the period $\Delta T$ must be decreased to, for example, $\Delta T'$ so that the varied frequency can be partly counted. However, in this case, frequency counters as many as corresponding numbers of $\Delta T/\Delta T'$ must be prepared which is realistically difficult and has been a significant problem in the prior art.

SUMMARY OF THE INVENTION

An object of the present invention is to count not only an average frequency of the signal in a counting interval but also the partly varied frequency of the signal.

Another object of the present invention is to count the partly varied frequency of the signal in real time.

Yet another object of the present invention is to count the partly varied frequency of the signal simply and at low cost of equipment.

The above objects are accomplished by: delaying the input signal as much as a predetermined time so that a delayed signal is produced; detecting delayed zero-cross pulses from the delayed signal and zero-cross pulses from the (non-delayed) input signal; counting a first number of the delayed zero-cross pulses after the predetermined time is over and a second number of the zero-cross pulses; detecting, from moment to moment, a number difference between the first number and the second number by subtracting the first number from the second number; and counting the partly varied frequency of the input signal by halving the amount of the number difference. Wherein, the predetermined time is set so as to be longer than a period of the zero-cross pulses, in other words, a half period of the signal frequency. When the predetermined time is set long, the average signal frequency can be counted, and when it is set short comparing with an interval of the variation of the partly varied frequency, the partly varied frequency of the input signal can be counted in a real time.

BRIEF DESCRIPTION OF THE DRAWINGS

FIG. 1 is a block diagram of the prior art frequency counter;

FIG. 5(a) is a waveform of the clear pulse;

FIG. 5(b) is a waveform of the mask signal;

FIG. 5(c) is a waveform illustrating a state that the number of the zero-cross pulses of the input signal is counted;

DESCRIPTION OF THE PREFERRED EMBODIMENTS

Figure 2:
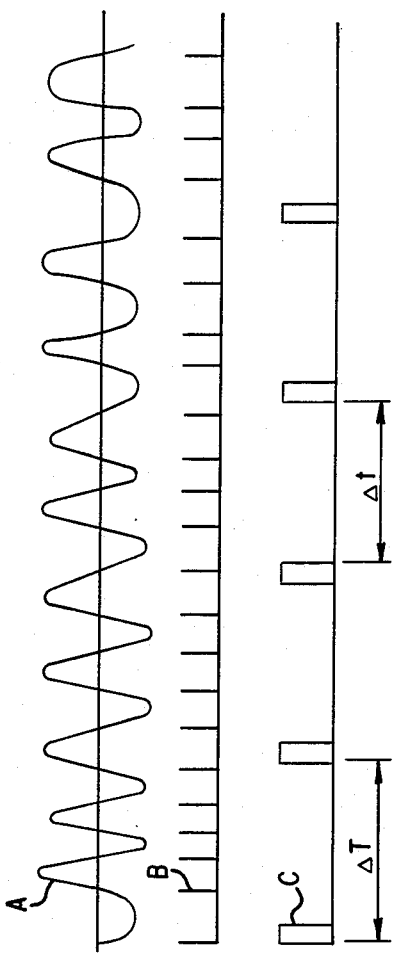
FIG. 2(a) is an input signal to be counted by the prior art frequency counter.
FIG. 2(b) is a zero-cross signal of the input signal to be counted by the prior art frequency counter.
FIG. 2(c) is a synchronizing signal for counting the pulses of the zero-cross signal of the input signal to be counted by the prior art frequency counter.
Figure 3:
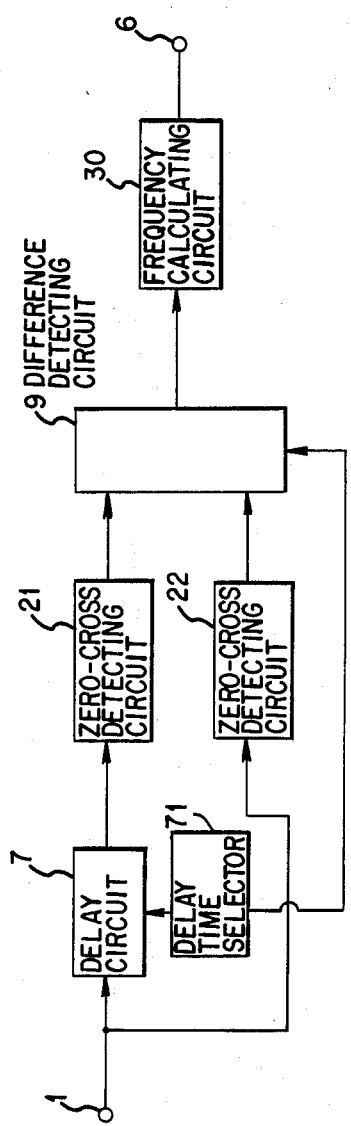
FIG. 3 is a block diagram for illustrating the principle of a frequency counter embodying the present invention.

The principle of the present invention will be explained referring to FIG. 3. I FIG. 3, the same reference numeral as in FIG. 1 designates the same block or part as in FIG. 1. In FIG. 3, an input signal, whose frequency is intended to be counted, given to an input terminal 1 is led to a delay circuit 7 and also to a zero-cross detecting circuit 22. In the delay circuit 7, the input signal is delayed as much as a delay time $\Delta t_d$ having a value which is previously designated by switching a delay time selector 71. The delay time $\Delta t_d$ is set so as to be longer than a half period of the signal frequency, in other words, a period of the zero-cross pulses. When the delay time $\Delta t_d$ is set long, the average frequency of the input signal can be counted, and when it is set short comparing with the interval of the variation of the partly varied frequency, the partly varied frequency of the input signal can be counted in real time. The delayed output signal from the delay circuit 7 is led to another zero-cross detecting circuit 21. Wherein, the function of the zero-cross detecting circuits 21 and 22 are same as the zero-cross detecting circuit 2 in FIG. 1, and the zero-cross detecting circuit will be abbreviated as "zero-cross detector" hereinafter. Both outputs from the zero-cross detectors 21 and 22 are led to a difference detecting circuit 9 in which the difference between the pulse numbers of the zero-cross signal of the input signal and the zero-cross signal (delayed zero-cross signal) of the delayed input signal is counted from moment to moment.

Figure 4:
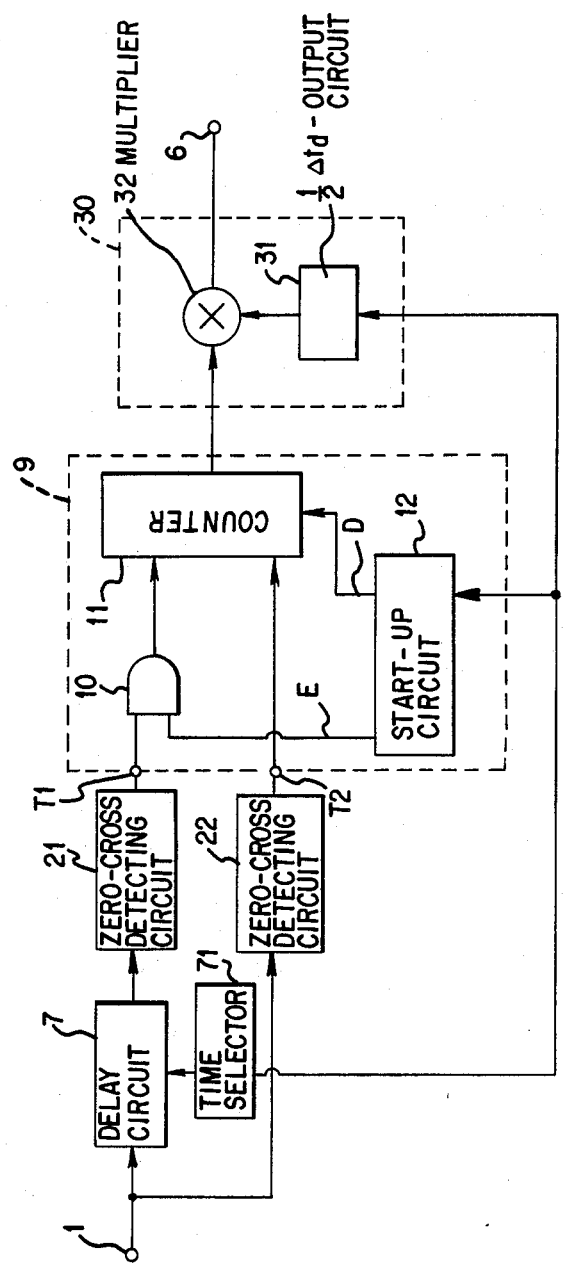
FIG. 4 is a block diagram for illustrating the constitution of the frequency counter embodying the present invention.

The difference detecting circuit 9 comprises an AND gate 10, a start-up circuit 12 and an counter 11 as shown in FIG. 4. FIG. 4 is a block diagram of a frequency counter embodying the present invention. In FIG. 4, the same reference numeral as in FIG. 3 designates the same block or part as in FIG. 3. In FIG. 4, the zero-cross signals from the zero-cross detectors 21 and 22 are led to the difference detecting circuit 9 through terminals T1 and T2 respectively. The start-up circuit 12 produces a clear pulse D and a mask signal E. FIGS. 5(a) and 5(b) show waveforms of the clear pulse D and the mask signal E respectively. The mask signal E is given to the AND gate 10 and the pulses of the delayed zero-cross signal, which will be called "delayed zero-cross pulses" hereinafter, from the zero-cross detector 21 are also given to the AND gate 10, so that the delayed zero-cross pulses from the zero-cross detector 21 are stopped to be led to the terminal T1 of the counter 11 as long as the mask signal E is applied to the AND gate 10. Meanwhile, the zero-cross pulses from the zero-cross detector 22 are led directly to the terminal T2 of the up-down counter 11.

The clear pulse D, shown in FIG. 5(a), is applied to the counter 11 for clearing counted numbers in the counter 11. The mask signal E has a negative square waveform and is previously set so that its level becomes low in coincident with the leading edge of the clear pulse D and is kept in low until a time, equal to the delay time $\Delta t_d$, passes from the trailing edge of the clear pulse D. When the clear pulse D is given to the counter 11, the counter 11 is completely cleared before the clear pulse D is over. After the clear pulse D is over, as long as the mask signal E is applied to the AND gate 10, only the zero-cross pulses from the zero-cross detector 22 are led to the up-down counter 11, and after the mask signal E is over, the delayed zero-cross pulses from the zero-cross detector 21 are led to the up-down counter 11 through the AND gate 10.

Figure 6:
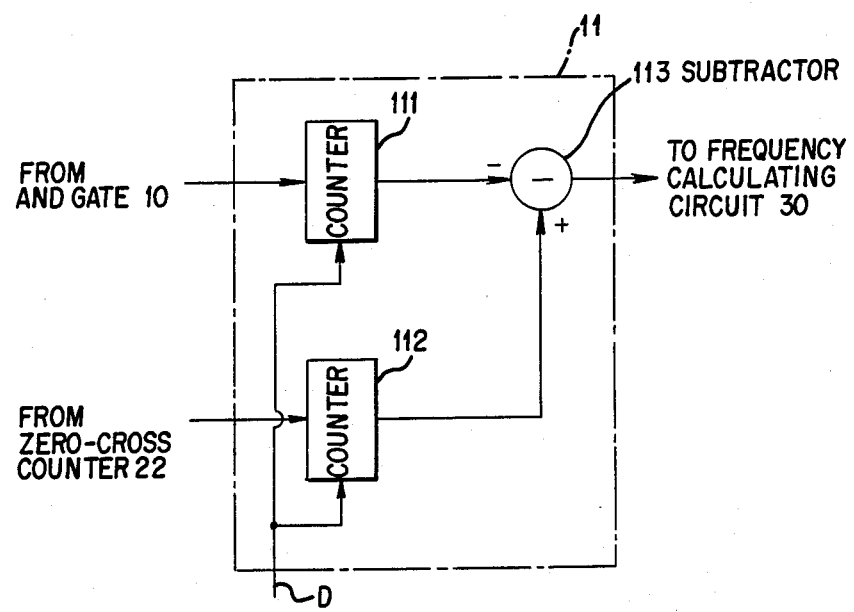
FIG. 6 is a block diagram of the up-down counter in the difference detecting circuit of the frequency counter embodying the present invention.

FIG. 6 shows the details of the up-down counter 11. In FIG. 6, the same reference numeral or symbol as in FIG. 4 designates the same block or part as in FIG. 4. As shown in FIG. 6, the counter 11 comprises a counter 111, a counter 112 and a subtractor 113. The counters 111 and 112 count the delayed zero-cross pulses from the zero-cross detector 21 and the zero-cross pulses from the zero-cross detector 22 respectively. The outputs from the counters 112 and 113 are led to the subtractor 113 at which the number counted by the counter 111 is subtracted from the number counted by the counter 112, in real time.

When the clear pulse D is applied to the counters 111 and 112, the numbers counted in the counters 111 and 112 are cleared. After the clear pulse D is over, the zero-cross pulses from the zero-cross detector 22 are counted at the counter 112 and its output is applied to the subtractor 113. However, during the mask signal E is applied to the AND gate 10, the counter 111 has no input, so that there is no output from the counter 111, in other words, no subtraction is performed in the subtractor 113. Accordingly, only the counted output from the counter 112 is the output from the subtractor 113 as shown in FIG. 5(c). After the mask signal E is over, the delayed zero-cross pulses from the zero-cross detector 21 are led to the counter 111, so that the counted number of the delayed zero-cross pulses is subtracted from the counted number of the zero-cross pulses. As a result, the subtractor 113 outputs from moment to moment a difference between the counted number of the zero-cross pulses and that of the delayed zero-cross pulses as shown in the relation of FIGS. 7(c) and 7(d).

Figures 7A, 7B, 7C, 7D:
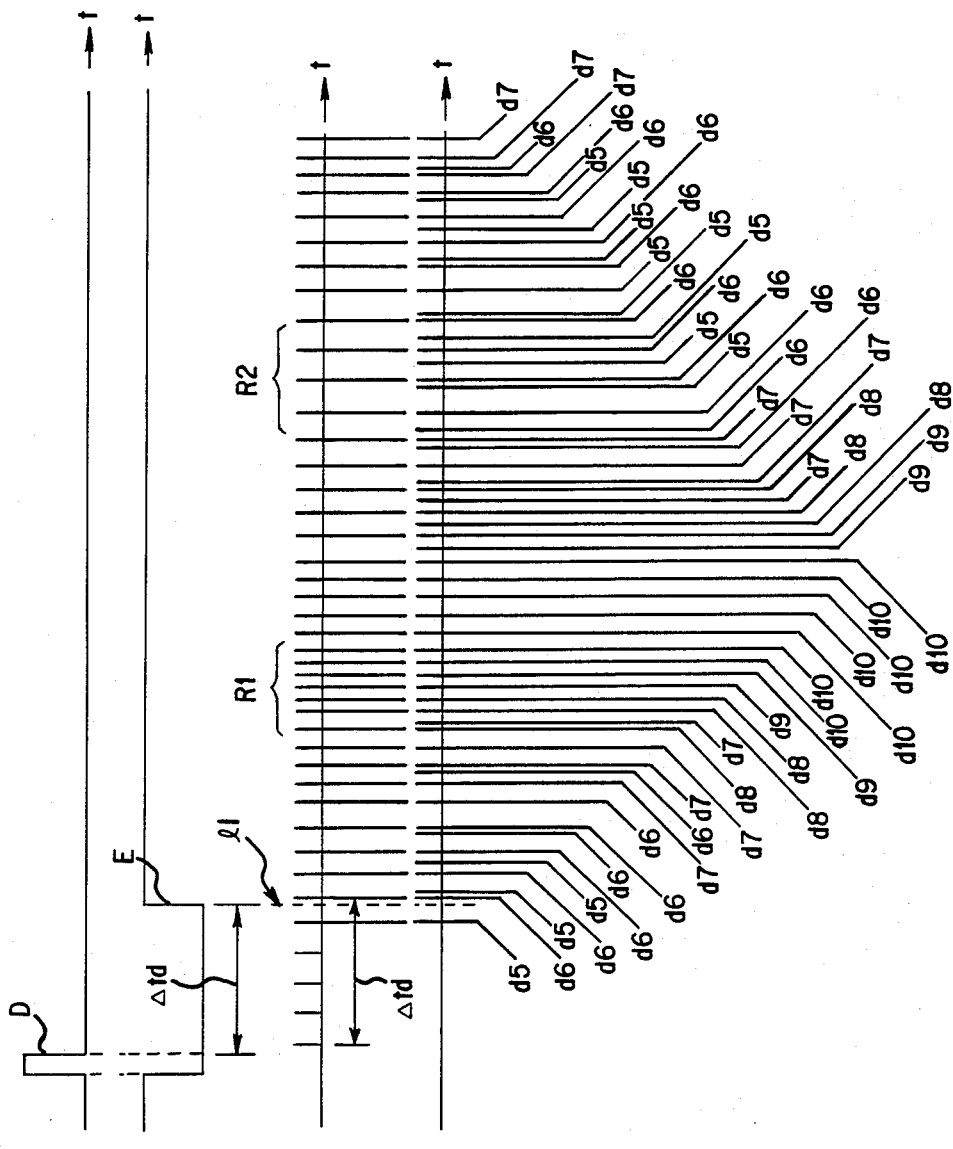
FIG. 7(a) is a waveform of the clear pulse.
FIG. 7(b) is a waveform of the mask signal.
FIG. 7(c) is a timing chart of the zero-cross pulses of the input signal.
FIG. 7(d) is a timing chart of the delayed zero-cross pulses of the delayed input signal.

In FIGS. 7(a), 7(b), 7(c) and 7(d), the same reference symbol as in FIGS. 5(a), 5(b) and 5(c) designates the same waveform or time as in FIGS. 5(a), 5(b) and 5(c). FIG. 7(a) shows the waveform of the clear pulse D, FIG. 7(b) shows that of the mask signal E, FIG. 7(c) shows the zero-cross pulses to be counted in the counter 112 and FIG. 7(d) shows the delayed zero-cross pulses to be counted in the counter 111. The numerals, such as d5, d6, - - - d10, written under FIG. 7(d), indicate the difference output numbers from the subtractor 113; for example, d5 indicates that the difference output number is 5. The counters 111 and 112 are cleared by the clear pulse D, so that there is no output from the subtractor 113. After the clear pulse D is over, the counter 112 counts the zero-cross pulses from the zero-cross detector 22. However, the delayed zero-cross pulses from the zero-cross detector 21 are not applied to the counter 111. Therefore, the difference output number is only the counted number from the counter 112; that is the difference output number is d5 which is indicated under FIG. 7(d) at the left hand side of a dotted vertical line 11. After the mask signal E is over, the counted number from the counter 112 increases to six, so that the difference output number becomes d6. When the first counted number from the counter 111 is applied to the subtractor 113, the difference output number reduces to d5. Thus, the subtraction are continued from moment to moment until the next clear pulse D, which is not shown in FIG. 7(a), is applied to the difference detecting circuit 9. As a result, the series of the difference output numbers, such as d5, d6, d5, - - - , d8, d9, d10, d10, - - - d6, d5, - - - , are obtained as shown in the lower part of FIG. 7(d). It can be seen from the series of the difference output numbers that the partly varied frequency of the input signal can be counted in real time. That is, the difference output numbers corresponding to a first region R1, in which the varied frequency increases, of the zero-cross pulses in FIG. 7(c) increase high, and those corresponding to a second region R2, in which the varied frequency decreases, of the zero-cross pulses in FIG. 7(c) decrease low.

The average frequency and the partly varied frequency of the input signal is counted by a frequency calculating circuit 30 in FIG. 4. The frequency calculating circuit 30 comprises a multiplier 32 by which the frequencies are calculated, particularly the partly varied frequency is calculated in real time, and a circuit 31 for outputting the value of $\frac{1}{2}\Delta t_d$; wherein, the value of the delay time $\Delta t_d$ is applied from the delay time selector 71. That is, the average frequency or the partly varied frequency of the input signal is counted at the multiplier 32 by multiplying the difference output number from the subtractor 113 and $\frac{1}{2}\Delta t_d$ together.

While the invention has been particularly shown and described in reference to preferred embodiments thereof, it will be understood by those skilled in the art that changes in form and details may be made therein without departing from the spirit and scope of the invention.

What is claimed is:

1. A frequency counter for counting a frequency of an input signal, said frequency counter, comprising:
    delaying means for delaying the input signal as much as a predetermined time and for producing a delayed signal, said predetermined time being selectable so as to be longer than a half period of the frequency of the input signal;
    first detecting means for detecting delayed zero-cross pulses from said delayed signal;
    second detecting means for detecting zero-cross pulses from the input signal; and
    difference detecting means for counting a first number of said delayed zero-cross pulses after said predetermined time is over and a second number of said zero-cross pulses during the predetermined time and after the predetermined time is over, and for detecting difference between said first and second numbers by subtracting said first number from said second number from moment to moment.

2. A frequency counter according to claim 1 further comprising frequency calculating means for calculating the input signal frequency from said difference of numbers between said first number and said second number.

3. A frequency counter according to claim 1, wherein said difference detecting means comprises:
    a start-up circuit for producing a clear pulse and a mask signal having a square waveform, so that a starting edge of said clear pulse coincides with that of said mask signal and said mask signal is terminated just after a time equal to said predetermined time has passed from an ending edge of said clear pulse;
    an AND gate for stopping said delayed zero-cross pulses passing therethrough as long as said mask signal is applied thereto; and
    counter means having:
        a first counter for producing said first number by counting said delayed zero-cross pulses passed through said AND gate, after said first counter is cleared by said clear pulse;
        a second counter for producing said second number by counting said zero-cross pulses after said second counter is cleared by said clear pulse; and
        a subtractor for subtracting said first number from said second number.

* * * * *